United States Patent
Wintermantel

(10) Patent No.: US 7,274,922 B2
(45) Date of Patent: Sep. 25, 2007

(54) CIRCUIT ARRANGEMENT FOR GENERATING AN IQ-SIGNAL

(75) Inventor: Markus Wintermantel, Lindau (DE)

(73) Assignee: A.D.C. Automotive Distance Control Systems GmbH, Lindau (DE)

(*) Notice: Subject to any disclaimer, the term of this patent is extended or adjusted under 35 U.S.C. 154(b) by 480 days.

(21) Appl. No.: 11/018,844

(22) Filed: Dec. 20, 2004

(65) Prior Publication Data
US 2005/0156659 A1 Jul. 21, 2005

Related U.S. Application Data

(63) Continuation of application No. PCT/DE03/02051, filed on Jun. 18, 2003.

(30) Foreign Application Priority Data
Jun. 18, 2002 (DE) .............................. 102 50 607

(51) Int. Cl.
H04B 1/26 (2006.01)
(52) U.S. Cl. ...................... 455/323; 327/254
(58) Field of Classification Search .................... None
See application file for complete search history.

(56) References Cited
U.S. PATENT DOCUMENTS

| 3,293,552 A | 12/1966 | Sichak et al. |
| 3,324,251 A | 6/1967 | Sichak et al. |
| 3,324,397 A | 6/1967 | Harvey |
| 4,672,567 A | 6/1987 | Kelly et al. |
| 4,717,917 A | 1/1988 | Alitz |

(Continued)

FOREIGN PATENT DOCUMENTS

EP    1 091 483    4/2001

(Continued)

OTHER PUBLICATIONS

C. L. Lee et al., "Bit-Sliced Median Filter Design Based on Majority Gate" IEE Proceedings G. Electronic Circuits & Systems, Institution of Electrical Engineers, Stevenage. GB, vol. 139, No. 1, Feb. 1992, pp. 63-71, XP000293218 ISSN: 0622-0039.

(Continued)

Primary Examiner—Thanh Cong Le
(74) Attorney, Agent, or Firm—W. F. Fasse; W. G. Fasse

(57) ABSTRACT

Circuits generate an IQ voltage or current signal having orthogonal I- and Q-parts of approximately equal amplitude from an electric input signal having a frequency varying slightly around a carrier frequency, without needing a complex mixer. The circuit includes at least one ohmic resistance and at least one reactance connected in series (for a voltage) or in parallel (for a current). The reactance has an impedance at the carrier frequency approximately matching the resistance value of the ohmic resistance. The I- and Q-parts of the voltage signal are tapped as voltage drops across the resistance and the reactance. With two such series circuit branches in parallel, both voltage signal parts can be referenced directly to a reference potential, e.g. ground. The I- and Q-parts of the current signal are tapped as currents flowing through the resistance and the reactance. The circuit can be integrated at the output of a bandpass filter.

18 Claims, 6 Drawing Sheets

U.S. PATENT DOCUMENTS

| | | | |
|---|---|---|---|
| 4,723,553 | A | 2/1988 | Miwa et al. |
| 4,875,050 | A | 10/1989 | Rathi |
| 4,963,036 | A | 10/1990 | Drisko et al. |
| 5,983,082 | A * | 11/1999 | Hilbert ........................ 455/76 |
| 6,369,633 | B1 | 4/2002 | Tsukahara |
| 7,010,287 | B2 * | 3/2006 | Oh et al. .................... 455/318 |
| 2002/0063606 | A1 | 5/2002 | Maria van Seijl |
| 2005/0138096 | A1 | 6/2005 | Wintermantel |
| 2006/0036353 | A1 | 2/2006 | Wintermantel |

FOREIGN PATENT DOCUMENTS

| | | |
|---|---|---|
| GB | 1023960 | 3/1966 |
| WO | 98/19177 | 5/1998 |

OTHER PUBLICATIONS

E. Ataman et al.: "A fast method for real-time median filtering" IEEE Transactions on Acoustics, Speech and Signal Processing, vol. 28, No. 4, Aug. 1980, pp. 415-421, XP001160948 New York US.

* cited by examiner

• sampling moments = distance gates 0...39

• sampling moments distance gates 0...39

US 7,274,922 B2

CIRCUIT ARRANGEMENT FOR GENERATING AN IQ-SIGNAL

CROSS-REFERENCE TO RELATED APPLICATIONS

This application is a Continuation under 35 U.S.C. §111, 120 and §365 of PCT International Application PCT/DE03/02051, filed on Jun. 18, 2003, which designated the United States, and which was published in a language other than English. The entire disclosure of the PCT International Application is incorporated herein by reference. Also, this application is related to U.S. applications Ser. Nos. 11/018,813 and 11/018,865, both filed on Dec. 20, 2004.

PRIORITY CLAIM

Through the above identified PCT International Application, this application claims the priority under 35 U.S.C. §119 of German Patent Application 102 50 607.8, filed on Jun. 18, 2002. The entire disclosure of the German Priority Application is incorporated herein by reference.

FIELD OF THE INVENTION

The invention relates to a circuit arrangement for generating an IQ-signal consisting of mutually orthogonal I- and Q-parts having approximately equal amplitudes from an electric input signal.

BACKGROUND INFORMATION

An IQ-signal consists of two orthogonal signal parts with identical amplitude, namely an I-part (in-phase) and a Q-part (quadrature), whereby the I-part leads the Q-part by 90° in case of positive frequencies and lags the Q-part by 90° in case of negative frequencies. Thus an IQ-signal can also be considered as a complex signal, the I-part representing the real part and the Q-part representing the imaginary part.

IQ-signals are very often used in signal processing; for instance for modulation methods, in which the required bandwidth can be halved by using IQ-signals, or for speed measurement via Doppler shifting in pulse reflection methods, not only the value of the relative speed but also the sign thereof can be determined by using IQ-signals.

For generating IQ-signals, it is conventionally known to use a complex mixer consisting of two orthogonal real mixers, up to the present date. That adds to the complexity and expense of circuit arrangements for generating IQ-signals

SUMMARY OF THE INVENTION

It is an object of the present invention to provide a simplified alternative circuit arrangement that generates an IQ-signal from a real continuous or pulsed signal with a carrier frequency $f_T$ (transfer frequency or intermediate frequency) and a relatively small useful signal band around this carrier frequency without using mixers. This circuit arrangement shall be implemented with very low hardware expenditure. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in a circuit arrangement including a circuit for generating an IQ voltage signal from an electrical input signal, wherein the IQ voltage signal has an I-part and a Q-part that are orthogonal to each other and that both have approximately the same amplitude as each other, wherein the electrical input signal has an input signal frequency that varies in a limited range about a carrier frequency, and wherein the circuit comprises:

first and second terminals adapted to have the input signal applied to at least one of the terminals;

at least one series circuit branch respectively including at least one ohmic resistance and at least one reactance (e.g. capacitance or inductance) connected respectively in series with one another between the first and second terminals, wherein the reactance has an impedance at the carrier frequency that approximately corresponds to the resistance value of the ohmic resistance respectively in each series circuit branch; and a plurality of output tap nodes at opposite sides of a selected output resistance among the at least one ohmic resistance and at opposite sides of a selected output reactance among the at least one reactance, wherein a first pairing of the output tap nodes is adapted to tap and output the I-part or the Q-part of the IQ voltage signal across the output resistance and a second pairing of the output tap nodes is adapted to tap and output the other Q-part or I-part of the IQ voltage signal across the output reactance.

Also, the above objects have been achieved according to the invention in a circuit arrangement including a circuit for generating an IQ current signal from such an electrical input signal, wherein the IQ current signal has an I-part and a Q-part that are orthogonal to each other and that both have approximately the same amplitude as each other, wherein the circuit comprises:

first and second terminals adapted to have the input signal applied to at least one of the terminals;

a parallel circuit including an ohmic resistance and a reactance (e.g. capacitance or inductance) connected parallel with one another between the first and second terminals, wherein the reactance has an impedance at the carrier frequency that approximately corresponds to the resistance value of the ohmic resistance; and a first output tap node connected to the resistance and adapted to tap and output the I-part or the Q-part of the IQ current signal as a current flowing through the resistance and a second output tap node connected to the reactance and adapted to tap and output the other Q-part or I-part of the IQ current signal as a current flowing through the reactance.

The basic starting point for both circuit arrangements is the exploitation of the known effect, that in a series or parallel connection of a reactance and an ohmic resistance, the voltage drops across these passive elements as well as the currents flowing through them are phase delayed relative to each other by ±90° respectively.

For meeting the further requirement of an IQ-signal, namely the identical amplitude of the I-part and of the Q-part, the impedance of the reactance at the carrier frequency is selected to match or correspond approximately, i.e. within the technically required tolerances, to the resistance value of the ohmic resistance. In the useful signal band around the carrier frequency, the impedance of the reactance inevitably deviates slightly from the ohmic resistance due to the signal frequency variation, so that the I- and the Q-parts have only approximately identical amplitudes. The minimal variations or deviations, in general, however, can be neglected. It should be noted that also when using complex mixers for the IQ-generation in conventional circuit arrangements for this purpose, small amplitude errors can occur by asymmetries of the real mixers.

For input signals with a relatively small bandwidth around the carrier frequency (this is true for most of the applications) it is, therefore, possible in a surprisingly simple manner to tap suitable (i.e. technically useful and satisfactory) IQ-signals by simple RC- or RL-modules.

If an IQ-signal in the form of two voltage signals phase-delayed by 90° from each other but having approximately equal amplitudes is to be provided at the output, this is achieved by tapping the two signal parts respectively from a reactance and an ohmic resistance connected in series with each other.

However, it is disadvantageous in such a single series circuit branch that only one of the signal parts will be directly referenced to the circuit reference potential, e.g. ground if the IQ-signal is to be sampled and digitized by an A/D converter, which requires voltage referenced to ground.

If, however, as is usually the case, the input signal is applied to an input terminal relative to a second terminal at the reference potential, which as a rule is ground, and if both output signal parts shall also be referenced to ground, then this can be achieved in a surprisingly simple manner by providing two series branches of the abovementioned type each including an ohmic resistance and a reactance. The two series branches are connected in parallel with each other between the two terminals. The order of the resistance and the reactance is reversed in the two branches such that in one branch the resistance is connected to the reference potential and in the other branch the reactance is connected to the reference potential. The two signal parts are then tapped respectively from the two circuit branches, and particularly across the respective element connected to the reference potential in each of the branches.

If the total resistance of the present dual-branch arrangement is to remain the same as that of the above single-branch arrangement, then the individual resistances must each have twice the resistance value as the single resistance of the circuit having only a single series branch, due to the parallel connection of two branches in the presently discussed arrangement. In a similar manner, the reactances must each have twice the inductance or one-half the capacitance of the corresponding single reactance of the single branch arrangement. A further advantage of this arrangement—as can be easily proven by calculation—is that an identical load of the two outputs does not affect the IQ-character of the signal, as their phase and amplitude ratios do not change; such a load occurs e.g. with sampling of the IQ-signal by a dual A/D converter.

It is particularly preferable to implement this circuit arrangement as an integral component of a bandpass filter, for example an optimum filter, at its output side. In general, a bandpass filter of this type is always required to separate the signal from other useful signal bands and/or noise components in another spectral position.

The generated IQ-signal with the carrier frequency $f_T$ can be transferred into the base band by corresponding sampling; here it is a prerequisite that the useful signal band around the carrier frequency $f_T$ lies in the transmission or pass band of the sampler, whereas the sampling frequency is usually very small in comparison with the carrier frequency.

Apart from an IQ-generation also an additional frequency shifting of the signal is necessary in some applications. As this cannot be implemented in the same step with the present inventive method for IQ-generation (in contrast to the conventional IQ-generation method using a complex mixer), it is proposed to realize the frequency shifting e.g. after sampling and digitizing the generated IQ-signal by a digital modulation.

The carrier frequency $f_T$, to which the IQ-signals are referenced, can be positive or negative. For the initial real signal, this does not involve a principal change, for the IQ-signal, however, the rotating direction in the complex level or plane changes with the sign of the carrier frequency and thus the position in the spectrum. Also for this reason, in the arrangement for generating the IQ-signal, the taps of the I- and the Q-parts are interchanged for reversed carrier frequency sign.

A circuit arrangement of this type can preferably be used for the input side processing of a signal for systems to detect objects. These systems detect the distance, the relative velocity, the relative angle or the image information of objects in a target area. Systems are used for this purpose, which emit waves and evaluate their echoes. In doing so, waves of different physical nature (e.g. sound waves or electromagnetic waves) and of a different wavelength (with electromagnetic waves, e.g. in the range of infrared or radar) are used. Systems of this type are used in particular for regulating the distance and the driving speed of vehicles.

BRIEF DESCRIPTION OF THE DRAWINGS

Hereinafter the invention will become apparent from the following description of example embodiments taken in conjunction with the drawings.

DETAILED DESCRIPTION OF PREFERRED EXAMPLE EMBODIMENTS AND OF THE BEST MODE OF THE INVENTION

Figure 1A:
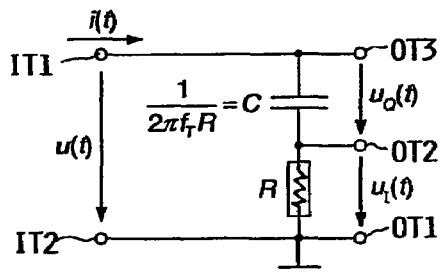
FIG. 1A is a schematic circuit diagram of a simple circuit for generating an IQ-voltage signal for $f_T>0$ by means of a series connection of ohmic resistance and capacitance, as well as tapping of the IQ-voltage signal.
Figure 1B:
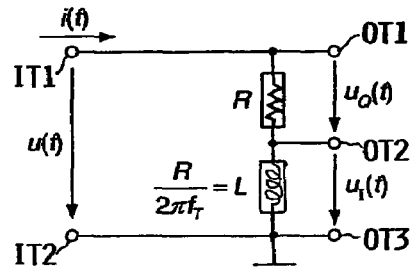
FIG. 1B is a schematic circuit diagram of an alternative simple circuit for generating an IQ-voltage signal for $f_T>0$ by means of a series connection of ohmic resistance and inductance, as well as tapping of the IQ-voltage signal.
Figure 1C:
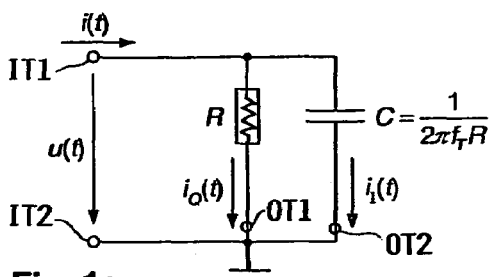
FIG. 1C is a schematic circuit diagram of a circuit for generating an IQ-current signal for $f_T>0$ by means of a parallel connection of ohmic resistance and capacitance, as well as tapping of the IQ-current signal.
Figure 1D:
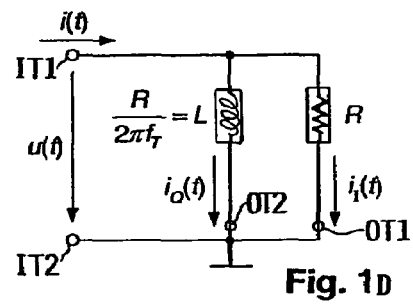
FIG. 1D is a schematic circuit diagram of an alternative circuit for generating an IQ-current signal for $f_T>0$ by means of a parallel connection of ohmic resistance and inductance, as well as tapping of the IQ-current signal.

FIGS. 1A and 1B show the generation of an IQ-voltage signal for $f_T$>0 by means of a series connection of ohmic resistance R and reactance C or L as well as tapping of the IQ-voltage signal, FIGS. 1C and 1D show the generation of an IQ-current signal by means of a parallel connection of ohmic resistance R and reactance C or L as well as tapping of the IQ-current signal.

Consequently, an electric input signal with voltage u(t) and/or current i(t) is applied to a first input terminal IT1 relative to a second input terminal IT2, which is connected to a reference potential or particularly grounded (⊥) in this example. The input signal varies about a carrier frequency $f_T$ and in comparison with the carrier frequency is preferably narrow-band. Starting from a carrier frequency of 200 MHz a useful signal bandwidth of 25 kHz is used in an application considered in detail below, without significant interference occurring due to the slightly deviating amplitude.

The input signal can be a voltage signal u(t) or a current signal i(t) and is supplied to a series connection of an ohmic resistance (or concretely a resistor) R and a reactance (L,C), a capacitance (or concretely a capacitor) C being used in FIG. 1A as the reactance, and an inductance (or concretely an inductor or coil L) being used as the reactance in FIG. 1B. At the carrier frequency ($f_T$), the impedance of the reactance corresponds approximately to the resistance value of the ohmic resistance.

If an IQ-voltage signal is to be generated for positive carrier frequencies $f_T$>0 with an I-part $u_I(t)$ and a Q-part $u_Q(t)$ which is phase-delayed by −90° relative to the I-part, when using a coil with the inductance L as the reactance, the I-part $u_I(t)$ is to be tapped from a pair of output tap nodes OT2 and OT3 across the inductance, whereas the Q-part $u_Q(t)$ is to be tapped from another pair of output tap nodes OT1 and OT2 across the ohmic resistance R, as is outlined in FIG. 1B. As an alternative, a capacitance C can be used as a reactance, in which case the Q-part $u_Q(t)$ is tapped via the no(des OT3 and OT2 across the capacitance C, and the I-part $u_I(t)$ is tapped via nodes OT2 and OT1 across the ohmic resistance R, as shown in FIG. 1A.

For negative carrier frequencies $f_T$<0 (not shown) an IQ-voltage signal with an I-part $u_I(t)$ and a Q-part $u_Q(t)$ which is phase-delayed by +90° relative to the I-part, is generated in an analogous manner, namely if:

an inductance L is used as a reactance, then the Q-part $u_Q(t)$ is tapped across this inductance, while the I-part $u_I(t)$ is tapped across the ohmic resistance R; or as an alternative:

a capacitance C is used as a reactance, then the I-part $u_I(t)$ is tapped across this capacitance, while the Q-part $u_Q(t)$ is tapped across the ohmic resistance R.

However, the disadvantage of the simple circuit arrangements shown in FIGS. 1A and 1B is that only one signal part, i.e. either the I-part or the Q-part but not both, can have a direct reference to the ground potential. For this reason, it is preferable to use one of the circuit arrangements according to FIG. 2A or 2B, which each have two series branches P1 and P2 of a respective series-connected reactance and ohmic resistance, whereby the two series branches are connected parallel to each other between the first input terminal IT1 receiving the input signal and the second input terminal IT2 at the reference potential.

Figure 2A:
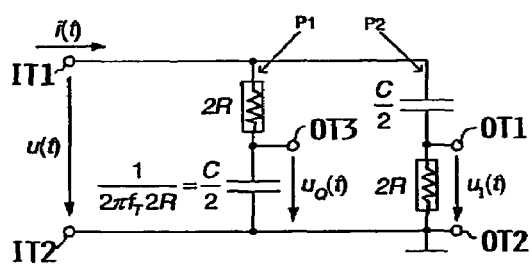
FIG. 2A is a schematic circuit diagram of a more advantageous circuit for generating an IQ-voltage signal for $f_T>0$ by means of a parallel arrangement of two series circuit branches of ohmic resistance and capacitance, as well as tapping of the IQ-voltage signal with respect to the ground potential.
Figure 2B:
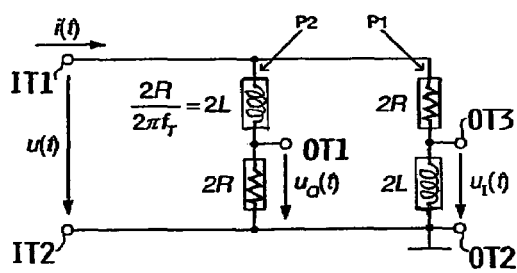
FIG. 2B is a schematic circuit diagram of an alternative more advantageous circuit for generating an IQ-voltage signal for $f_T>0$ by means of a parallel arrangement of two series circuit branches of ohmic resistance and inductance, as well as tapping of the IQ-voltage signal with respect to the ground potential.

In the first branch P1, the reactance (C/2 in FIG. 2A or 2L in FIG. 2B) is connected with the reference potential (e.g. ground=⊥). Thus, a first part of the signal can be tapped across the reactance via the output tap nodes OT3 and OT2 with reference to ground. More particularly, with a capacitance C/2 as the reactance as shown in FIG. 2A the Q-part $u_Q(t)$ will be tapped here, and with an inductance 2L as a reactance as shown in FIG. 2B the I-part $u_I(t)$ will be tapped here. The second branch P2 respectively includes a series connection of ohmic resistance 2R and reactance C/2 or 2L. In the second branch P2, the ohmic resistance 2R is connected with the reference potential (⊥), and the respective other part of the IQ-signal is tapped via nodes OT1 and OT2 across this resistance 2R. Namely in the circuit of FIG. 2A having the capacitance C/2 as the reactance, the I-part $u_I(t)$ will be tapped across the resistance 2R, while in the circuit of FIG. 2B having an inductance 2L as the reactance, the Q-part $u_Q(t)$ will be tapped across the resistance 2R.

In order to keep the complex total resistance of the circuits in FIGS. 2A and 2B equal compared to the circuits in FIGS. 1A and 1B, for the parallel connection of two series connections of this type the resistance value of the resistance is doubled, i.e. for the complex impedances their respective inductances are doubled or the capacitances are halved, respectively.

FIGS. 1C and 1D show embodiments of the circuit arrangements for generating an IQ-current signal $i_I(t)$, $i_Q(t)$. Here the input signal u(t) or i(t) respectively is supplied to the first input terminal IT1 relative to the second reference or ground input terminal IT2 of a parallel connection of an ohmic resistance R and a reactance C or L. The impedance of the reactance at the carrier frequency ($f_T$) corresponds approximately to the resistance value of the ohmic resistance. The IQ current signal parts $i_I(t)$ and $i_Q(t)$ are tapped respectively at output tap nodes OT1 or OT2 as currents flowing through the ohmic resistance R or the reactance L, C.

For positive carrier frequencies $f_T$>0 an I-part $i_I(t)$ and a Q-part $i_Q(t)$ which is phase-delayed by −90° relative to the I-part are respectively produced if:

an inductance L is used as the reactance, then the Q-part $i_Q(t)$ is detected as the current flowing through the inductance L, and the I-part $i_I(t)$ is detected as the current flowing through the ohmic resistance R, as shown in FIG. 1D;

or as an alternative:

a capacitance C is used as the reactance, then the I-part $i_I(t)$ is detected as the current flowing through the capacitance C, and the Q-part $i_Q(t)$ is detected as the current flowing through the ohmic resistance R, as shown in FIG. 1C.

Figure 7:
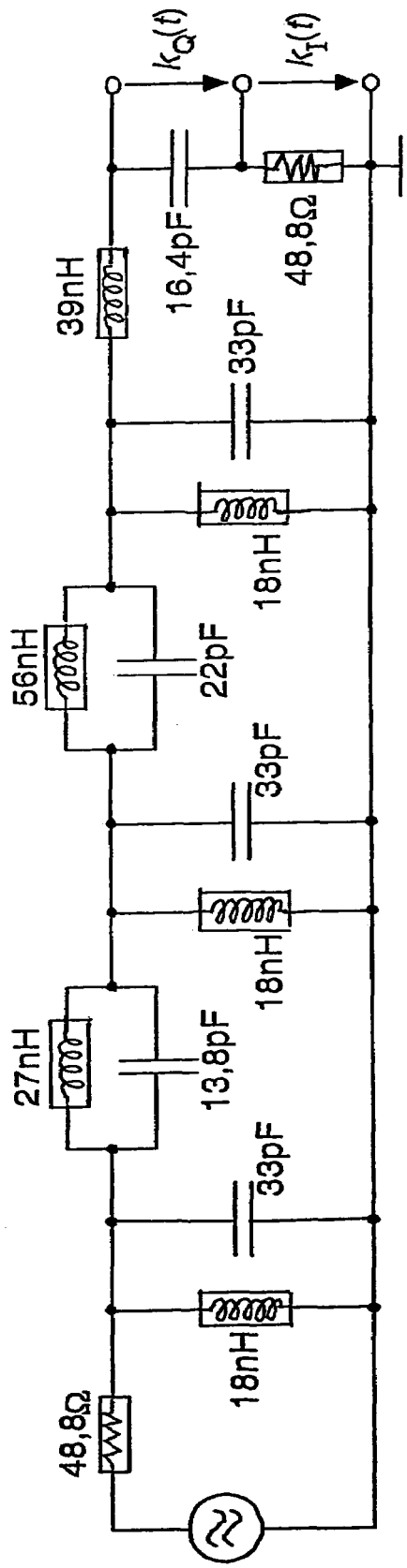
FIG. 7 is a circuit diagram of a first example embodiment of an optimum filter.
Figure 8:
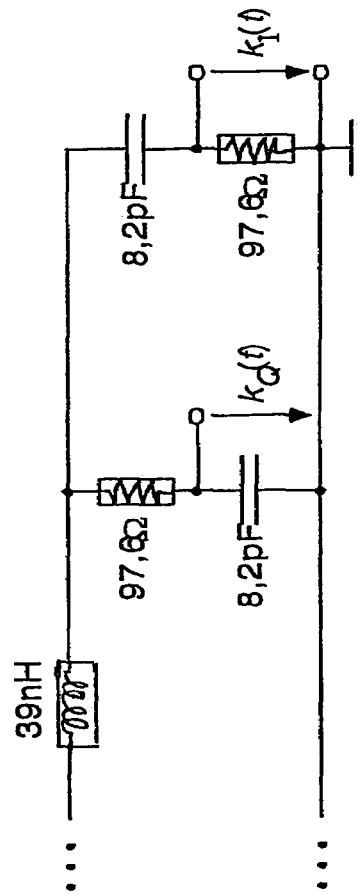
FIG. 8 is a circuit diagram of a second, preferred example embodiment of an optimum filter for a pulsed system with a carrier frequency $f_T$=200 MHz and a pulse duration of 25 ns, which generates an IQ voltage signal having two signal parts referenced to ground at the output.

FIGS. 7 and 8 outline a bandpass embodied as an optimum filter for a pulsed system with a carrier frequency of 200 MHz and a pulse duration of 25 ns, which generates an IQ-voltage signal at the output by means of the above described connections. The embodiment in FIG. 8 shows the special advantage that the I- and the Q-parts both are referenced to ground.

Hereinafter the invention shall be presented in an example embodiment when being used in a radar system in particular for a passenger car.

Modern motor vehicles are increasingly provided with a distance control system based on radar, which detects the distance, velocity and relative angle of the motor vehicle running ahead.

A known radar system of such kind for instance is the FMCW-system (Frequency Modulated Continuous Wave) developed by the company Bosch, in which two physical values, i.e. the distance and the relative velocity of a moving or standing body, are mapped to one physical value, i.e. the frequency. For this purpose signals are permanently transmitted and the signals reflected by the moving body are received. Conclusions can be drawn as to the searched values (i.e. values of interest to be determined) from the frequency response curve of transmitted and received signals and from the frequency difference of these signals respectively. A separation of velocity and distance is possible by evaluating several signals, the so-called chirps, with different frequency slope. Two chirps would be sufficient for a single target. For multi-target situations at least three chirps are needed.

For operating a radar system of this type in particular an oscillator (VCO) with low phase noise is required, which provides preferably linear frequency ramps, what is not possible offhand and what makes the RF-part of the radar system very elaborate. In traffic situations with many different targets, as it is often the case with guardrails and in city centers, problems arise with the target detection and separation, as all targets are present in an antenna beam in each associated chirp spectrum. Therefore, exact extraction of the different targets is not possible or it does not always meet one's expectations.

To avoid these problems, the pulse modulated Doppler radar system provides a solution. With this method a target is mapped to one or more consecutive distance gates. The received signal is sampled appropriately. The exact distance can then be gained from the amplitude ratio of the sampled values in consecutive distance gates.

However, the pulse modulated Doppler system has a low signal-to-noise ratio (S/N) based on the reduced medium or average output power. Due to the broadband receiving path, this radar system is also more sensitive to interferences.

For recognizing the sign of the velocity, the pulse modulated Doppler method performs complex sampling of the received signal. Radar systems according to the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding its phase and amplitude noise can be used, and as no frequency ramps have to be produced With such a radar system, for a measuring cycle, a plurality, e.g. 1024, of transmit pulses are evaluated or analyzed per reception antenna. Their (time) spacing is then e.g. 2.5 μs. In addition, the (time) spacing is pseudo-noise encoded to avoid trappings and interferences.

When using a large number of transmit pulses, more accurate velocity measuring and a high integration gain are possible and beyond that, the noise produced due to the pseudo-noise encoding is low so that a more optimum signal-to-noise ratio can be achieved.

Figure 3:
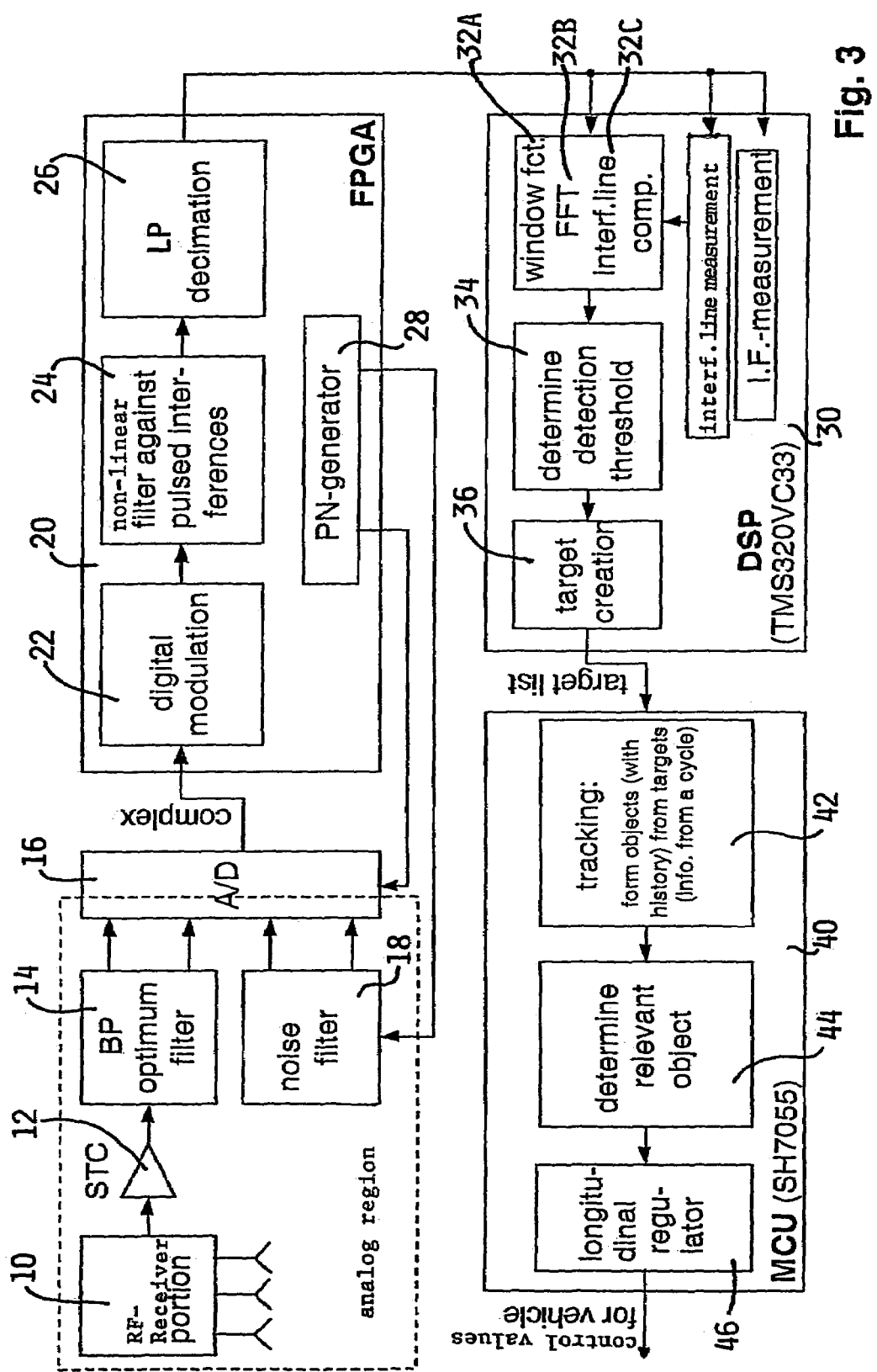
FIG. 3 is a block circuit diagram of a pulse modulated Doppler radar system, in which the received signal is converted into an IQ-signal by a circuit arrangement according to the invention provided on the input side.

On the basis of a block diagram, FIG. 3 shows the pulse modulated Doppler radar system in accordance with the invention. The individual elements of this system, in particular the optimum filter and the elements of the FPGAs are described in detail below.

The radar system comprises an RF-reception or receiver part 10 with a downstream amplifier 12, band pass optimum filter 14 and A/D converter 16. At the output of the A/D converter 16, a complex output signal can be picked off or tapped, which can be fed to a downstream FPGA 20. The FPGA 20 includes a digital modulation system 22, the median filter 24 against interferences in the form of pulses, and a decimation filter 26 embodied as a low-pass, which are arranged and connected in series. The FPGA unit 20 further includes a PN (pseudo noise) generator 28. In addition, a noise filter 18 is provided, which precedes the A/D converter 16.

After the FPGA 20, a digital signal processor (DSP) 30 is next in line, and in the present case comprises a system for producing a window function 32A, an FFT-system (Fast Fourier Transformation) 32B as well as an interference line compensator 32C. Subsequently, starting from this the detection threshold is determined in block 34 and is fed to a system 36 for targeting, which produces a target list. Next in line after the DSP 30 is a micro controller unit (MCU) 40, which, starting from the target list, produces control values for the vehicle as needed. For this purpose, at first tracking of the target list is performed in block 42, and a relevant object is determined in block 44. The information on this is fed to a longitudinal controller or regulator 46, which then produces the desired control values. The function of the DSP 30 and of the MCU 40 can, of course, alternatively be fulfilled by a single program-controlled unit, for instance by a micro computer.

Figure 4:
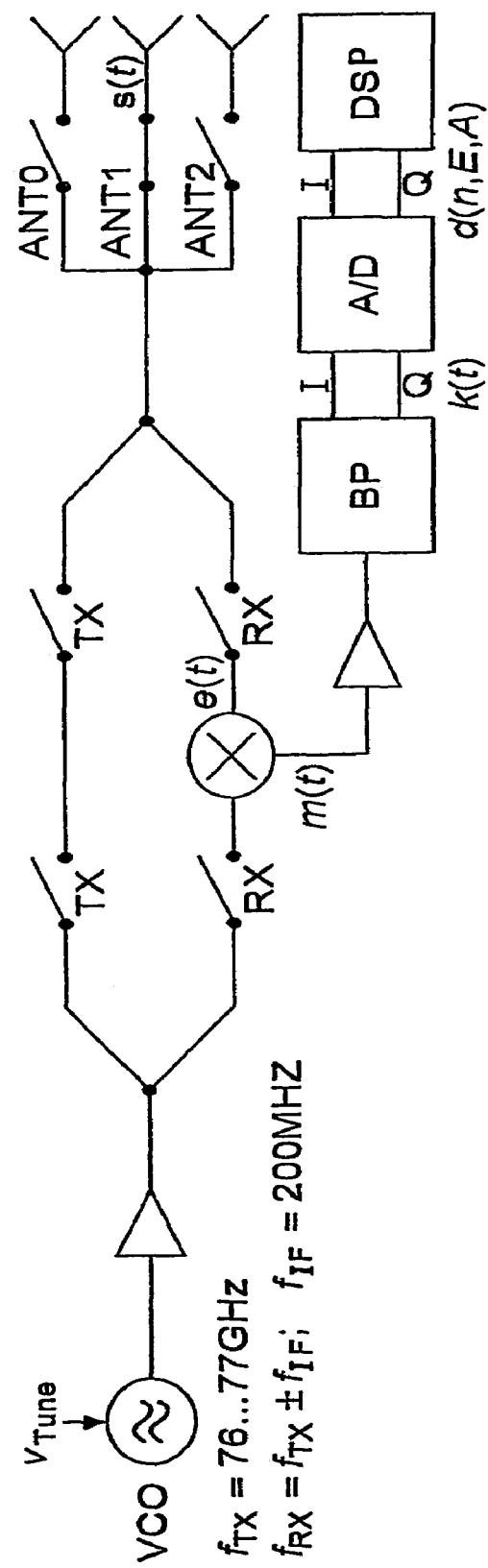
FIG. 4 is a simplified schematic circuit diagram for explaining the principle of the Doppler method.
Figure 5A:
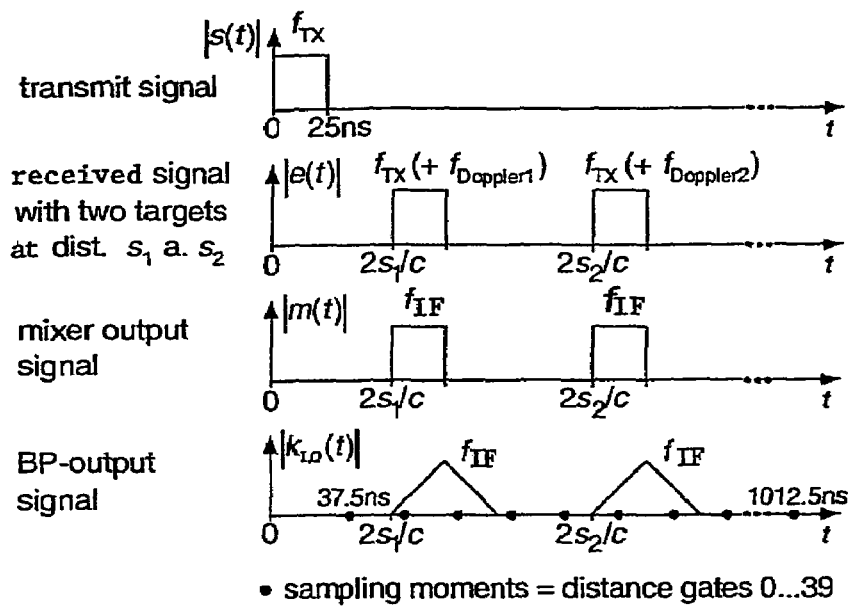
FIGS. 5A, 5B and 5C are signal-time/sample graphs for the several identified signals in the circuit diagram according to FIG. 4.
Figure 5B:
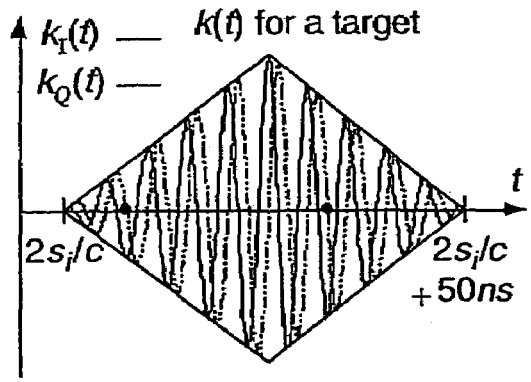
Figure 5C:
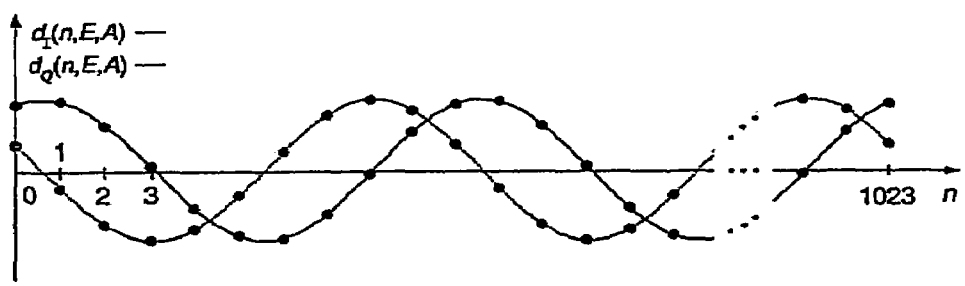

Hereinafter the Doppler method shall be described in short by way of FIGS. 4 and 5. FIG. 4 shows by way of a simplified diagram the principle of the Doppler method and FIGS. 5A, 5B and 5C show the signal-time graph for the signals in the diagram according to FIG. 4.

With the Doppler method, a complex sampling of the received signal is performed to recognize the sign of the velocity. Radar systems with the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding phase and amplitude noise can be used, and as no frequency ramps have to be produced.

A measurement cycle takes for example 50 ms each. The measuring result is a target list, i.e. a snapshot of the traffic situation. To each measurement cycle, 5 measurement blocks are associated, namely an interference line measurement block, an I.F.-measurement block as well as three antenna measurement blocks (one for each antenna). Each of these measurement blocks takes 2.76 ms. In this time for instance 1024+64 transmit pulses are produced, the first 64 transmit pulses serving for the start-up transient effect of the filters and thus not being used for evaluation. After each transmit pulse, sampling is performed 40 times at intervals of 25 ns each. This ensures that each target is detected in at least one distance gate.

Via the switches ANT0 to ANT2 one of the three antennas is selected. By closing the transmit switches TX for 25 ns, the signal of the oscillator is provided to the selected antenna and is then radiated from this antenna.

After this transmitting of a rectangular transmit pulse, the reception switches RX are closed and the frequency of the oscillator is changed by 200 MHz. In this way the received pulses are transformed via the mixer to an intermediate frequency of 200 MHz. The Doppler shift of the frequency must not be considered at this point. The real signal m(t) resulting this way is transmitted to a passive band pass embodied as an optimum filter, which has two orthogonal outputs with identical amplitudes and thus produces the complex signal k(t), i.e. an IQ-signal has been realized without a complex mixing.

After each transmit pulse, the IQ-signal at the output of the band pass filter is sampled 40 times at time spacings or intervals of 25 ns. The individual sampling times or moments correspond to one distance range each—they are so-called distance gates with a width of 3.75 m which reach as far as to a distance of 150 m. As a rectangular receiving pulse with a length of 25 ns is smoothed by the band pass filter to a triangular pulse of double the length and thus is generally visible in two consecutive distance gates, the exact distance can be interpolated by analyzing or evaluating the amplitude ratio of these two distance gates (see FIG. 5B).

For detecting the relative velocity of the targets with regard to one's own vehicle and for increasing the signal-to-noise ratio, the complex receiving signals of 1024 consecutive transmit pulses are analyzed in each distance gate E, without changing the selected antenna A. For the case of equidistant transmit pulses, FIG. 4 shows the real and imaginary part $d_I(n,E,A)$ and $d_Q(n,E,A)$ of the 1024 complex sampled values d(n,E,A) of one distance gate, in which there is a relatively moving target. During the short observation period of 2.56 ms for the 1024 sampled values the relative velocity can always be considered as constant. The phase changes uniformly from sampled value to sampled value, as the distance of the target and thus the phase of the receiving pulse change uniformly—exactly the Doppler frequency including its sign results (since the signal is complex).

The method just described is used sequentially for each of the three antennas. One of the antennas is oriented or "looks" exactly straight forward, whereas the two others are directed somewhat to the left and right respectively to be able in this way to determine the position of the detected targets relative to one's own driving lane.

The received signal always contains an interference portion or component, which can be noticed as a noise. The interference has approximately the characteristics of random white noise. In order to filter out this noise as well as possible, i.e. to achieve a maximum signal-to-noise ratio, an optimum filter is used. Its transfer function corresponds to the spectrum of the received intermediate frequency pulses (I.F.-pulses), i.e. to the spectrum of a rectangle modulated at 200 MHz with the pulse length 25 ns. Thus the optimum filter corresponds to a bandpass.

Advantageously, the used optimum filter is realized as an LC-quadrupole embedded in ohmic resistances. In the examined frequency range this is an especially low-budget and flexible technology, as the inductances needed here are available as SMD-components. With this the filter circuit can be established in a very simple, small and thus also cost-effective manner.

When designing an optimum filter of this type in accordance with the known method according to Bader, two design strategies are possible:

1. At first a low-pass adapted to the requirements is designed. Subsequently, from it the low-pass is transformed into a band pass. However, this model is only contingently suitable and only for special circuits, as it leads to structures and component values that are unsuitable for implementing the circuit.

2. Direct design of a band pass filter: This model is in particular advantageous, although somewhat complex in its design, as it leads to different alternative structures, which, depending on the requirements, are more or less well adapted to the demanded circumstances. With this method at first an approximation of the ideal transfer function is performed.

Figure 6:
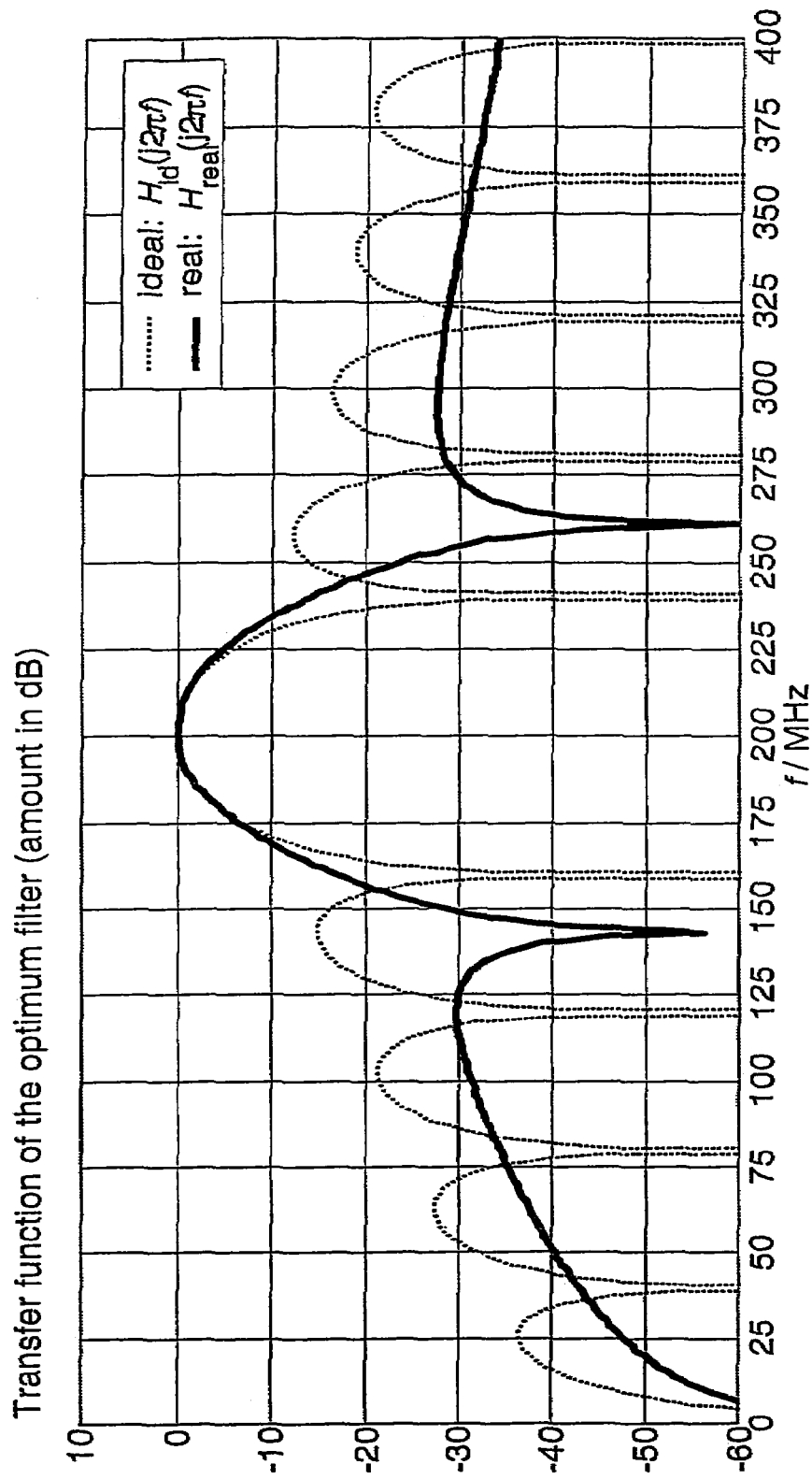
FIG. 6 shows the transfer functions of an ideal and of a real optimum filter.

FIG. 6 shows in dashed lines the transfer function of an optimum filter produced in the direct design; whereas the thin continuous curve belongs to the ideal optimum filter, which is approximated and reproduced very well by the real circuit.

FIG. 7 shows a first circuit arrangement for the implementation of an optimum filter approximated in accordance with Bader; here the values of the inductances, capacitances and resistances are rounded to real available values. Degrees of freedom in development have been exploited here such that advantageously no transformer is necessary. Contrary to its dual structure, the structure shown in FIG. 7 has ground capacitances from nearly all nodes, in which the stray capacitances can be included.

The output signals $k_I(t)$ and $k_Q(t)$ of the circuit in FIG. 7 are mutually orthogonal, i.e. they have a phase difference of 90° to each other, and have an identical amplitude at the intermediate frequency $f_{IF}$=200 MHz, what can be achieved by means of degrees of freedom in the design and development.

The complex output signal $k_I(t)+j*k_Q(t)$, hereinafter called the IQ-signal, thus is a complex oscillation for the real input oscillation with the intermediate frequency $f_{IF}$. This so-called IQ-signal has been implemented in an advantageous manner without any mixing.

It is particularly advantageous if the parts of the output signal respectively associated with the real part and the imaginary part, i.e. $k_I(t)$ and $k_Q(t)$, are embodied grounded. By way of a circuit diagram, FIG. 8 shows a second preferred example embodiment of an approximated optimum filter, which takes this demand into account. Basically, the output-side part of the filter circuit has been doubled in this regard.

The further great advantage of this modified output stage shown in FIG. 8 is that the I/Q-character of the output signal is maintained despite the ohmic and capacitive load by the A/D converter. Merely the filter characteristic changes marginally.

Consequently, a band-pass optimum filter embodied according to FIGS. 7 and 8, in summary, comprises the following advantageous functions:

The filter has an optimized signal-to-noise ratio.

The filter produces, in a simple but quite reliable manner, an IQ-signal that is accurate to the greatest possible extent, which can be picked off or tapped at the output of the filter.

As the rectangular output: signal is visible in two distance gates, and as the distance can be determined via the amplitude ratio, easy interpolation of the distance is possible in this way.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement including a circuit for generating an IQ voltage signal from an electrical input signal, wherein said IQ voltage signal has an I-part and a Q-part that are orthogonal to each other and that both have approximately the same amplitude as each other, wherein said electrical input signal has an input signal frequency that varies in a limited range about a carrier frequency, and wherein said circuit comprises:

first and second terminals adapted to have said input signal applied to at least one of said terminals;

at least one series circuit branch respectively including at least one ohmic resistance and at least one reactance connected respectively in series with one another between said first and second terminals, wherein said ohmic resistance has a resistance value and said reactance has an impedance at said carrier frequency that approximately corresponds to said resistance value respectively in each said series circuit branch; and a plurality of output tap nodes at opposite sides of a selected output resistance among said at least one ohmic resistance and at opposite sides of a selected output reactance among said at least one reactance, wherein a first pairing of said output tap nodes is adapted to tap and output a first part among said I-part and said Q-part of said IQ voltage signal across said output resistance and a second pairing of said output tap nodes is adapted to tap and output a second part among said I-part and said Q-part of said IQ voltage signal across said output reactance.

2. The circuit arrangement according to claim 1, not including any complex mixer.

3. The circuit arrangement according to claim 1, wherein said output resistance and said output reactance are connected in series with one another in a single said series circuit branch between said first and second terminals, two of said output tap nodes are respectively provided at opposite ends of said single series circuit branch, and at least one of said output tap nodes is provided between said output resistance and said output reactance.

4. The circuit arrangement according to claim 1, wherein:

said first terminal is adapted to have said input signal applied thereto relative to said second terminal which is adapted to have a fixed reference potential applied thereto;

said output reactance comprises a capacitance;

said first part of said IQ voltage signal tapped from said first pairing of said output tap nodes across said output resistance is said I-part and said second part of said IQ voltage signal tapped from said second pairing of said output tap nodes across said capacitance is said Q-part for a positive value of said carrier frequency with said Q-part phase-shifted by −90° relative to said I-part of said IQ voltage signal; and said first part of said IQ voltage signal tapped from said first pairing of said output tap nodes across said output resistance is said Q-part and said second part of said IQ voltage signal tapped from said second pairing of said output tap nodes across said capacitance is said I-part for a negative value of said carrier frequency with said Q-part phase-shifted by +90° relative to said I-part of said IQ voltage signal.

5. The circuit arrangement according to claim 1, wherein:

said first terminal is adapted to have said input signal applied thereto relative to said second terminal which is adapted to have a fixed reference potential applied thereto;

said output reactance comprises an inductance;

said first part of said IQ voltage signal tapped from said first pairing of said output tap nodes across said output resistance is said Q-part and said second part of said IQ voltage signal tapped from said second pairing of said output tap nodes across said inductance is said I-part for a positive value of said carrier frequency with said Q-part phase-shifted by −90° relative to said I-part of said IQ voltage signal; and said first part of said IQ voltage signal tapped from said first pairing of said output tap nodes across said output resistance is said I-part and said second part of said IQ voltage signal tapped from said second pairing of said output tap nodes across said inductance is said Q-part for a negative value of said carrier frequency with said Q-part phase-shifted by +90° relative to said I-part of said IQ voltage signal.

6. The circuit arrangement according to claim 1, wherein:

said first terminal is adapted to have said input signal applied thereto relative to said second terminal which is adapted to have a fixed reference potential applied thereto;

said circuit includes a first said series circuit branch having a first said ohmic resistance and a first said reactance connected in series with one another between said first and second terminals, and a second said series circuit branch having a second said ohmic resistance and a second said reactance connected in series with one another between said first and second terminals parallel to said first series circuit branch;

said first reactance is said output reactance and is connected to said second terminal, said first ohmic resistance is connected between said first reactance and said first terminal, and said second pairing of said output tap nodes is arranged to tap said second part of said IQ voltage signal across said first reactance being said output reactance; and said second ohmic resistance is said output resistance and is connected to said second terminal, said second reactance is connected between said second ohmic resistance and said first terminal, and said first pairing of said output tap nodes is arranged to tap said first part of said IQ voltage signal across said second ohmic resistance being said output resistance.

7. The circuit arrangement according to claim 1, being a bandpass circuit arrangement including said circuit for generating an IQ voltage signal as an output circuit section, and further including an input circuit section connected upstream to said first and second terminals.

8. The circuit arrangement according to claim 7, wherein said bandpass circuit arrangement is a bandpass optimal filter.

9. The circuit arrangement according to claim 1, including said circuit for generating an IQ voltage signal, and further including, connected in succession downstream to one or more of said output tap nodes, a sampling circuit, a digitizing circuit, and a frequency-shifting circuit including a digital modulator.

10. The circuit arrangement according to claim 1, for detecting a target object in a target area, further including:

a forward signal emitter adapted to emit a forward signal of forward signal pulses into said target area so that said forward signal pulses reflect from said target object and thereby form reflection pulses;

a reflection signal receiver that is adapted to receive a reflection signal including said reflection pulses, and that is connected to said first and second terminals so as to feed said reflection signal into said circuit for generating an IQ voltage signal; and an IQ signal processing circuit connected to one or more of said output tap nodes and adapted to process said IQ voltage signal;

wherein said forward signal emitter is selected from the group consisting of an infrared optical emitter, a radar emitter and an ultrasonic emitter, and said reflection signal receiver is respectively correspondingly selected from the group consisting of an infrared optical receiver, a radar receiver, and an ultrasonic receiver.

11. A circuit arrangement including a circuit for generating an IQ current signal from an electrical input signal, wherein said IQ current signal has an I-part and a Q-part that are orthogonal to each other and that both have approximately the same amplitude as each other, wherein said electrical input signal has an input signal frequency that varies in a limited range about a carrier frequency, and wherein said circuit comprises:

first and second terminals adapted to have said input signal applied to at least one of said terminals;

a parallel circuit including an ohmic resistance and a reactance connected parallel with one another between said first and second terminals, wherein said ohmic resistance has a resistance value and said reactance has an impedance at said carrier frequency that approximately corresponds to said resistance value; and a first output tap node connected to said resistance and adapted to tap and output a first part among said I-part and said Q-part of said IQ current signal as a current flowing through said resistance and a second output tap node connected to said reactance and adapted to tap and output a second part among said I-part and said Q-part of said IQ current signal as a current flowing through said reactance.

12. The circuit arrangement according to claim 11, not including any complex mixer.

13. The circuit arrangement according to claim 11, wherein:

said first terminal is adapted to have said input signal applied thereto relative to said second terminal which is adapted to have a fixed reference potential applied thereto;

said reactance comprises a capacitance;

said first part of said IQ current signal tapped via said first output tap node as said current flowing through said resistance is said Q-part and said second part of said IQ current signal tapped via said second output tap node as said current flowing through said capacitance is said I-part for a positive value of said carrier frequency with said Q-part phase-shifted by −90° relative to said I-part of said IQ current signal; and said first part of said IQ current signal tapped via said first output tap node as said current flowing through said resistance is said I-part and said second part of said IQ current signal tapped via said second output tap node as said current flowing through said capacitance is said Q-part for a negative value of said carrier frequency with said Q-part phase-shifted by +90° relative to said I-part of said IQ current signal.

14. The circuit arrangement according to claim 11, wherein:

said first terminal is adapted to have said input signal applied thereto relative to said second terminal which is adapted to have a fixed reference potential applied thereto;

said reactance comprises an inductance;

said first part of said IQ current signal tapped via said first output tap node as said current flowing through said resistance is said I-part and said second part of said IQ current signal tapped via said second output tap node as said current flowing through said inductance is said Q-part for a positive value of said carrier frequency with said Q-part phase-shifted by −90° relative to said I-part of said IQ current signal; and said first part of said IQ current signal tapped via said first output tap node as said current flowing through said resistance is said Q-part and said second part of said IQ current signal tapped via said second output tap node as said current flowing through said inductance is said I-part for a negative value of said carrier frequency with said Q-part phase-shifted by +90° relative to said I-part of said IQ current signal.

15. The circuit arrangement according to claim 11, being a bandpass circuit arrangement including said circuit for generating an IQ current signal as an output circuit section, and further including an input circuit section connected upstream to said first and second terminals.

16. The circuit arrangement according to claim 15, wherein said bandpass circuit arrangement is a bandpass optimal filter.

17. The circuit arrangement according to claim 11, including said circuit for generating an IQ current signal, and further including, connected in succession downstream to one or more of said output tap nodes, a sampling circuit, a digitizing circuit, and a frequency-shifting circuit including a digital modulator.

18. The circuit arrangement according to claim 11, for detecting a target object in a target area, further including:

a forward signal emitter adapted to emit a forward signal of forward signal pulses into said target area so that said forward signal pulses reflect from said target object and thereby form reflection pulses;

a reflection signal receiver that is adapted to receive a reflection signal including said reflection pulses, and that is connected to said first and second terminals so as to feed said reflection signal into said circuit for generating an IQ current signal; and an IQ signal processing circuit connected to one or more of said output tap nodes and adapted to process said IQ current signal;

wherein said forward signal emitter is selected from the group consisting of an infrared optical emitter, a radar emitter and an ultrasonic emitter, and said reflection signal receiver is respectively correspondingly selected from the group consisting of an infrared optical receiver, a radar receiver, and an ultrasonic receiver.

* * * * *